United States Patent [19]

Hirai et al.

[11] Patent Number: 4,893,154
[45] Date of Patent: Jan. 9, 1990

[54] ELECTROLUMINESCENT DEVICE

[75] Inventors: Yutaka Hirai, Tokyo; Masafumi Sano, Kawasaki; Hisanori Tsuda, Atsugi; Katsuji Takasu, Asaka, all of Japan

[73] Assignee: Canon Kabushiki Kaisha, Tokyo, Japan

[21] Appl. No.: 309,023

[22] Filed: Feb. 8, 1989

Related U.S. Application Data

[63] Continuation of Ser. No. 170,634, Mar. 16, 1988, abandoned, which is a continuation of Ser. No. 842,240, Mar. 21, 1986, abandoned.

[30] Foreign Application Priority Data

Mar. 28, 1985 [JP] Japan .................................. 60-62088

[51] Int. Cl.$^4$ ............................................. H01L 27/12
[52] U.S. Cl. ........................................ 357/4; 357/17; 357/2
[58] Field of Search ........................... 357/2, 17, 4 SL

[56] References Cited

U.S. PATENT DOCUMENTS 4,644,378  2/1987  Williams ............................... 357/17
4,787,089  11/1988  Hayakawa ............................ 357/17
4,794,611  12/1988  Hara ...................................... 357/17

OTHER PUBLICATIONS

Abeles et al., Physical Rev. Lett., vol. 51, No. 21, Nov. 20, 1983.
Abeles, Phys. Rev. Lett., vol. 51, No. 21, Nov. 21, 1985, pp. 2003–2006.

Primary Examiner—Martin H. Edlow
Attorney, Agent, or Firm—Fitzpatrick, Cella, Harper & Scinto

[57] ABSTRACT

An electroluminescent device, which emits light by recombination of the carriers injected or excited by light of energy of electrical field, comprising an active layer which includes a semiconductor layer of a super-lattice structure. The layer in the super-lattice structure is changed in effective band gap by an electrical field externally applied to vary the emitted light wavelength. The semiconductor layer of said super-lattice structure comprising an non-single crystalline semiconductor material.

5 Claims, 2 Drawing Sheets

ELECTROLUMINESCENT DEVICE

This application is a continuation of application Ser. No. 170,634 filed Mar. 16, 1988, now abandoned which is a continuation of application Ser. No. 842,240 filed on Mar. 21, 1986 now abandoned.

BACKGROUND OF THE INVENTION

1. Field of the Invention

This invention relates to an electroluminescent device, particularly to an electroluminescent device which emits light through recombination of carriers injected or excited by the energy of light or electrical field.

2. Related Background Art

Conventionally, electroluminescent devices utilizing electroluminescent phenomenon of semiconductors may be classified broadly into those utilizing the injection electroluminescent effect and those utilizing the electrical field electroluminescent effect. As the semiconductor material to be used, combinations of III-V group elements such as GaAs, Ga-Al-As, etc. or combinations of II-VI group elements such as ZnSe, ZnS, etc. may be used, and the band gap or the excitation level can be changed by changing the compositional ratio of the matrix material or changing the impurity introduced into the matrix material, whereby the emitted light wavelength can be changed. On the other hand, as to the structure of the device, in most cases, a PN junction, a PIN junction, a hetero junction, a Schottky junction, etc. is constructed by use of a single crystal. When a color display is designed to be constituted by arrangement of such electroluminescent devices, devices emitting three primary colors will be combined. Accordingly, it is necessary to select materials while taking the lattice constant and the band gap of the crystal corresponding to the respective colors. Also, since the number of the elements becomes so large, the mounting density is not so high, and there is also involved the problem of low resolution.

OBJECT OF THE INVENTION

An object of the present invention is, in view of the problems as described above, to provide an electroluminescent device of emitting light with any desired wavelength by changing the effective band gap with elcetrical field externally applied, thereby simplifying selection of the material for semiconductor material and also reducing the number of elements to realize a multi-color electroluminescent device improved in mounting density and resolution.

Another object of the present invention is to provide an electroluminescent device, which emits light by recombination of the carriers injected or excited by light or energy of electrical field, comprising an active layer of which a part or whole includes a semiconductor layer of a super-lattice structure which is changed in effective band gap by the electrical field externally applied, the semiconductor layer of said super-lattice structure comprising a non-single crystalline semiconductor material.

DETAILED OF DESCRIPTION OF THE PREFERRED EMBODIMENTS

Figure 1:
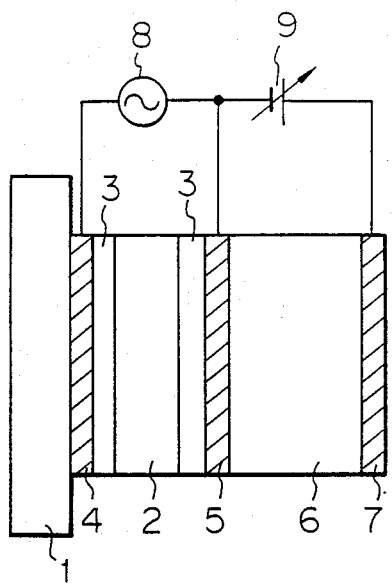
FIG. 1 is a sectional view of a first embodiment of the electroluminescent device of the present invention.

Referring now to the drawings, the embodiments of the present invention are described in detail.

The electroluminescent device of the present invention has a super-lattice structure portion having a nipi structure or a hetero junction and electrodes capable of applying externally on said super-lattice structure. In the case of injecting carriers from the electrode portion, as one electrode material, electrode materials forming barriers such as Schottky barrier are selected. Such as Pt, Pd, Au, etc. are selected for those electrode materials. On the other hand, when carriers are injected by PN junction or hetero junction, electrode materials forming ohmic contact such as Al, MO, ITO, etc. may be employed.

As the luminescent material constituting the super-lattice structure, non-single crystalline semi-conductor materials may be employed, including non-single crystalline semiconductor materials containing such as Si:H, Ge:H, Si-C:H, Si-Ge:H, Si-N:H where H is a terminator. As the terminator in these non-single crystalline semi-conductor materials, other than the above-mentioned H, a halogen such as F may also be used. The above materials may also be used as non-single crystalline semiconductor materials doped with p-type or n-type impurities.

The super-lattice structure is made to have a repeatedly laminated structure with at least two layers for respectively forming the quantum wells and forming barriers, desirably some ten layers, each single layer of the above material having a thickness preferably of 2 to 100 Å. The above super-lattice structure may be changed in band gap continuously by changing the composition ratio or the composition of the constituent materials for respective layers.

The electroluminescent device having the super-lattice structure comprising a non-single crystalline semiconductor material can emit light in the visible light range which could hardly be effected particularly with a single crystalline semiconductor.

Referring now to the drawings, the embodiments of the present invention are described below.

FIG. 1 is a sectional view of a first embodiment of the electroluminescent device of the present invention. On a substrate 1 is provided an electrode 4, on which a first luminous layer 2 (e.g. a-SiC:H) is provided as sandwiched by insulating layer 3(e.g. a-Si-N:H). Then, on the insulating layer 3, a second luminant layer 6 is provided as sandwiched between the transparent electrodes 5 and 7. The second luminous layer is a layer with a nipi structure, with the n-layer and p-layer being made of a-Si:H layer prepared by doping with B and P according to the optical CVD method at a substrate temperature of 50° C., and the i-layer being a non-doped a-Si:H layer.

Figure 2:
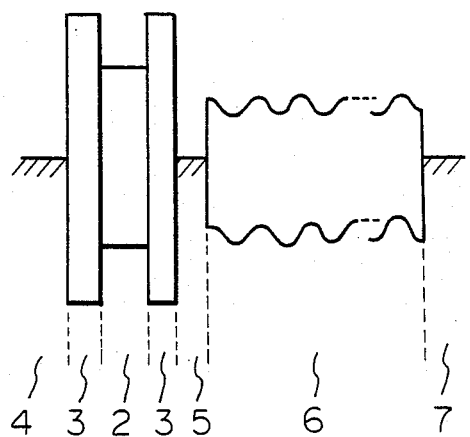
FIG. 2 is an illustration of the band of the above first embodiment.

FIG. 2 is an illustration of the band of the first embodiment. In the electroluminecent device with the above constitution, light is emitted from the first luminous layer 2 by energizing layer 2 with AC source 8, then, the emitted light excites the second luminous layer to effect light emission. The band gap of the second luminant layer 6 can be changed by the power source of 9 to effect a modulation or change of the emitted light wavelength.

Next, another embodiment of the electroluminescent device of the present invention is to be described.

Figure 3:
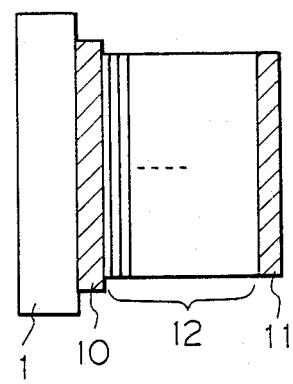
FIG. 3 is a sectional view of a second embodiment of the electroluminescent device of the present invention.

FIG. 3 is a sectional view of a second embodiment of the electroluminescent device of the present invention. On the substrate 1, an electrode 10 forming a Schottky junction is formed, and a luminous layer 12 with a nipi structure made of the same material and the same device constitution as the second luminant layer 6 shown in the foregoing embodiment is provided thereon, followed by provision of transparent electrode 11 thereon.

Figure 4:
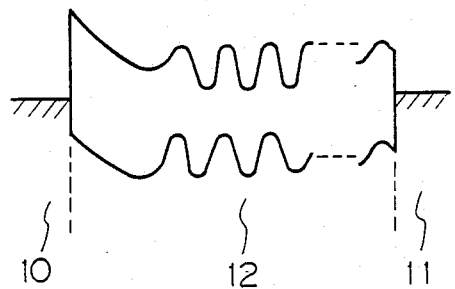
FIG. 4 is an illustration of the band of the above second embodiment.

FIG. 4 is an illustration of the band in the electroluminescent device shown in FIG. 3. The emitted light wavelength can be changed by the electrical field applied between the electrode 10 and the transparent electrode 11 shown in FIG. 3 during light emission by recombination of the electrons injected from the electrode 10 into the luminous layer 12.

Figure 5:
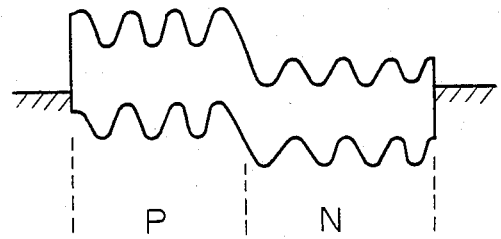
FIG. 5 is a sectional view of a third embodiment of the electroluminescent device of the present invention.

FIG. 5 is an illustration of the band of a third embodiment of the electroluminescent device of the present invention, showing an electroluminescent device incorporating a nipi structure into the PN junction device, with its structure being the same as the second embodiment in FIG. 3. Also in this electroluminescent device, the same modulation of the emitted light wavelength is similarly observed.

As described in detail above, according to the electroluminescent device of the present invention, by incorporating into a part or whole of an electroluminescent device a super-lattice structure which is changed in effective band gap by the electrical field externally applied, the emitted light wavelength can be freely changed by the electrical field externally applied, whereby choice of the material for the semiconductor material can be done with ease and also the number of devices can be reduced with improvement of real mounting density and resolution. Also, by making the material constituting the super-lattice structure a non-single crystalline semiconductor, it has become possible to emit light in the visible light region and therefore layer formation can be done at low temperatures in the manufacturing steps, whereby the steps can be simplified and electroluminescent devices useful for practical application can be provided.

What is claimed is:

1. An electroluminescent device, which emits light by recombination of the carriers injected or excited by light or energy of electrical field said electroluminescent device comprising:

an active layer at least a part of which is a non-monocrystalline semiconductor layer of a super-lattice structure having an effective band gap; and electrodes for applying variable voltage to said non-monocrystalline semiconductor layer of said super-lattice to change the effective band gap of the semiconductor layer.

2. An electroluminescent device according to claim 1, wherein said super-lattice structure is formed by alternately laminating thin films comprising at least two non-monocrystalline semiconductor materials selected from the group consisting of Si:H, Ge:H, Si-C:H, Si-Ge:H, and Si-N:H.

3. An electroluminescent device according to claim 1, wherein said non-monocrystalline material comprises silicon.

4. An electroluminescent device according to claim 2, wherein each of said thin films has a respective thickness in a range of 2–100 Å.

5. An electroluminescent device according to claim 3, wherein said non-monocrystalline semiconductor material comprises fluorine.

* * * * *